(12) United States Patent
Jeong et al.

(10) Patent No.: US 6,424,222 B1
(45) Date of Patent: Jul. 23, 2002

(54) VARIABLE GAIN LOW NOISE AMPLIFIER FOR A WIRELESS TERMINAL

(75) Inventors: Hoe-Sam Jeong; Seung-Wook Lee; Won-Seok Lee, all of Seoul (KR)

(73) Assignee: GCT Semiconductor, Inc., San Jose, CA (US)

(*) Notice: Subject to any disclaimer, the term of this patent is extended or adjusted under 35 U.S.C. 154(b) by 0 days.

(21) Appl. No.: 09/940,806

(22) Filed: Aug. 29, 2001

Related U.S. Application Data

(60) Provisional application No. 60/279,451, filed on Mar. 29, 2001.

(51) Int. Cl.[7] .................................................. H03G 3/10
(52) U.S. Cl. ........................................ 330/285; 330/278
(58) Field of Search ................................ 330/278, 285, 330/302

(56) References Cited

U.S. PATENT DOCUMENTS

| | | | | |
|---|---|---|---|---|
| 3,191,127 A | * | 6/1965 | Theriault | .................. 330/24 |
| 3,559,088 A | * | 1/1971 | Booth et al. | .................. 330/29 |
| 4,559,503 A | * | 12/1985 | Camand et al. | .............. 330/302 |
| 5,355,096 A | * | 10/1994 | Kobayashi et al. | ......... 330/278 |

* cited by examiner

Primary Examiner—Robert Pascal
Assistant Examiner—Henry Choe
(74) Attorney, Agent, or Firm—Fleshner & Kim, LLP

(57) ABSTRACT

A variable gain, low noise amplifier is described, which is suitable as the input amplifier for a wireless terminal, or as the pre-amplifier stage of a wireless terminal transmitter. The amplifier may achieve variable gain by deploying a network of transistors in a parallel array, each independently selectable by a PMOS switch, and providing the variable resistance for the resonant circuit. Power dissipation can also be mitigated by using a network of driving transistors, each independently selectable by a PMOS switch. The resonant frequency of the amplifier may be made tunable by providing a selection of optional pull-up capacitors.

22 Claims, 6 Drawing Sheets

VARIABLE GAIN LOW NOISE AMPLIFIER FOR A WIRELESS TERMINAL

BACKGROUND OF THE INVENTION

This application claims priority to U.S. Provisional Application Serial No. 60/279,451, filed Mar. 29, 2001, whose entire disclosure is incorporated herein by reference.

FIELD OF THE INVENTION

This invention relates generally to a circuit for controlling gain in low noise amplifiers (LNA's) or in preamplifiers, and more specifically to gain control circuitry for use in LNAs or preamplifiers used in wireless communication systems.

BACKGROUND OF THE RELATED ART

In wireless communication, the incident signal at a terminal unit (e.g. an handset) has various magnitudes, depending on the environment of the radio-wave propagation (including the distance between the terminal and the base station). A strongly radiated signal from a transmitting terminal is helpful to a remote station, but is of less use if the station is nearby. Such a strong signal may impose unwanted spurious signals on foreign terminals near the transmitter, and waste the transmitter's battery. Additionally, the circuit for amplification in a receiving terminal may clip and distort its output signal for a large magnitude input.

In general, the inward and the outward signal in a terminal are amplified by a low-noise amplifier (LNA) in the receiver block and a preamplifier in the transmitter block, respectively. Good linearity must be achieved in order to suppress the distortion in the next stages. To prevent the LNA from clipping its output signal for a large input, the LNA's gain has to be made controllable (the gain being lowered for large input signal). Similarly, the gain of a transmitter's preamplifier must be controlled so as not to waste the battery and also not to overdrive its next stage, the power amplifier.

FIG. 1 shows a related art low noise amplifier that employs current-splitting gain-control techniques. In related art gain-control schemes, the LNA's gain is decreased by reducing the drain bias current (i.e., by decreasing the gate bias voltage) of its subcircuit responsible for the gain, i.e., a differential-amplifier stage. If the magnitude of an input signal exceeds some prescribed level, then the LNA is entirely bypassed so that no amplification occurs. Unfortunately, the reduction of the bias current is accompanied by degradation of linearity caused by an unwanted cutoff of the driving transistor. An abrupt change of LNA's gain inherent in the bypass operation makes it hard to simultaneously achieve good linearity and the desired noise performance. Accordingly, a new approach is desirable to control the gain.

SUMMARY OF THE INVENTION

An object of the invention is to solve at least the above problems and/or disadvantages and to provide at least the advantages described hereinafter.

Another object of the invention is to provide a method and apparatus for controlling gain in a low-noise amplifier or in a transmitter's preamplifier.

Another object of the invention is to provide a low-noise amplifier and method of operating same that reduces or avoids clipping its output signal when receiving a large input signal.

Another object of the invention is to provide a method and apparatus capable of controlling the gain of a transmitter's preamplifier so as not to waste the battery and not to overdrive the next stage (the power amplifier).

In a preferred embodiment of the invention, a variable gain amplifier includes, at least in part, a first transistor having a control electrode, a first electrode, a second electrode and a drain, wherein an input signal is coupled to the control electrode, a first reference voltage is coupled to the first electrode and an output signal is coupled to the second electrode; a load inductor coupled between a second reference voltage and the second electrode of the first transistor; a load capacitor coupled to the second electrode of the first transistor; and a variable resistor coupled in parallel to the load inductor.

In another preferred embodiment of the invention, a multi-frequency amplifier includes, at least in part, a driving transistor having a source, a gate and a drain, wherein an input signal is input by an input terminal coupled to the gate, the source is coupled to a reference voltage source, and an output signal is output by an output terminal coupled to the drain; a load inductor coupled between a power voltage source and the output terminal; a load capacitor coupled between the output terminal and the reference voltage source; a variable resistor coupled between the power voltage source and the output terminal in parallel to the load inductor; and at least one pull-up capacitor deployed in parallel with the load inductor wherein each of the at least one pull-up capacitors are independently selectable by a plurality of switches coupling each of the at least one capacitors with the load inductor.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

A gain-control method and apparatus for a low-noise amplifier (e.g., tuned) and a preamplifier used in wireless communication systems will be described according to preferred embodiments of the present invention. For example, one preferred embodiment of the gain control method and apparatus can be adopted for the circuitry in a wireless terminal and implemented in an LNA or a preamplifier. However, the present invention is not interpreted to be so limited. Further, the invention is applicable to any type of device technologies, such as the bipolar-unction transistor (BJT or junction field-effect transistor JFET). For purposes of illustration, preferred embodiments according to the invention will be described below using metal-oxide-semiconductor field-effect transistor (MOSFET) technology.

Figure 1:
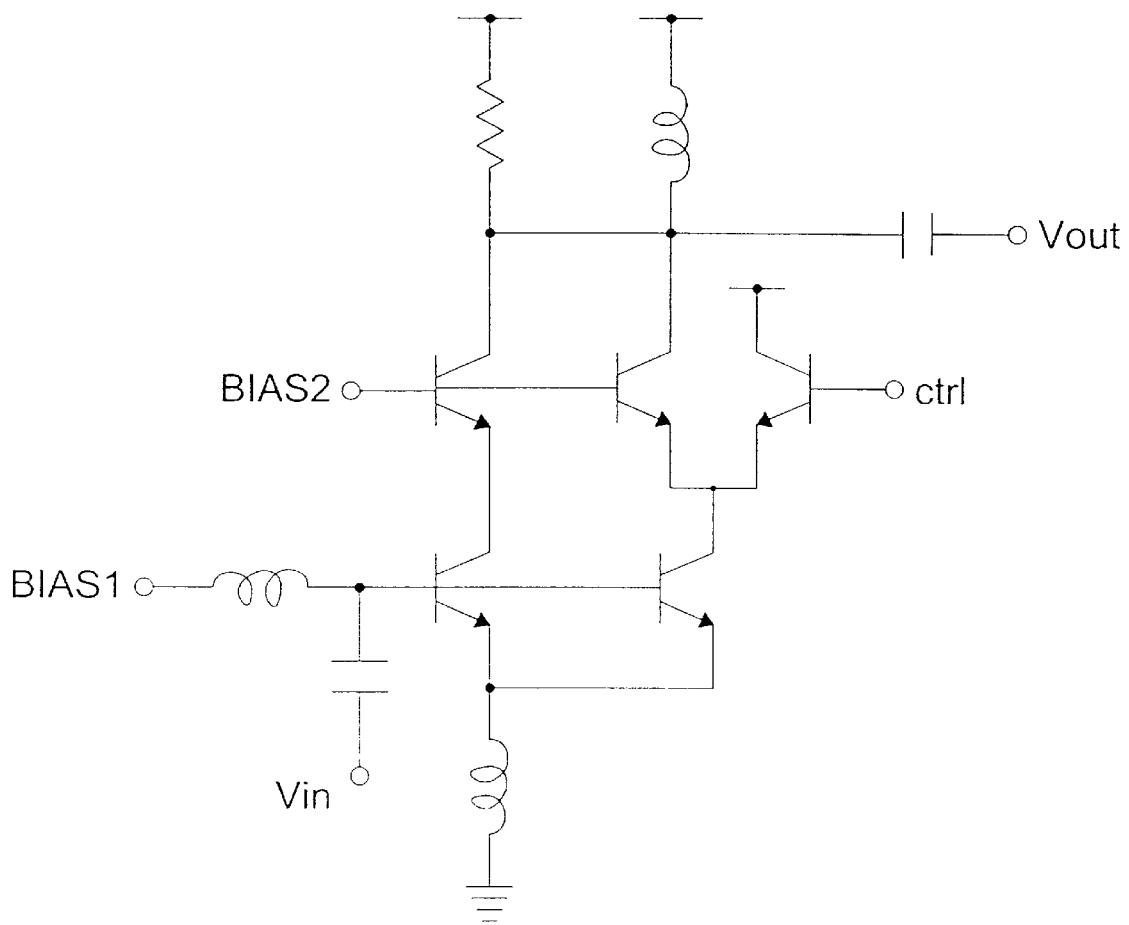
FIG. 1 is a circuit diagram of an LNA with current-splitting gain-control technique according to the related art.
Figure 2A:
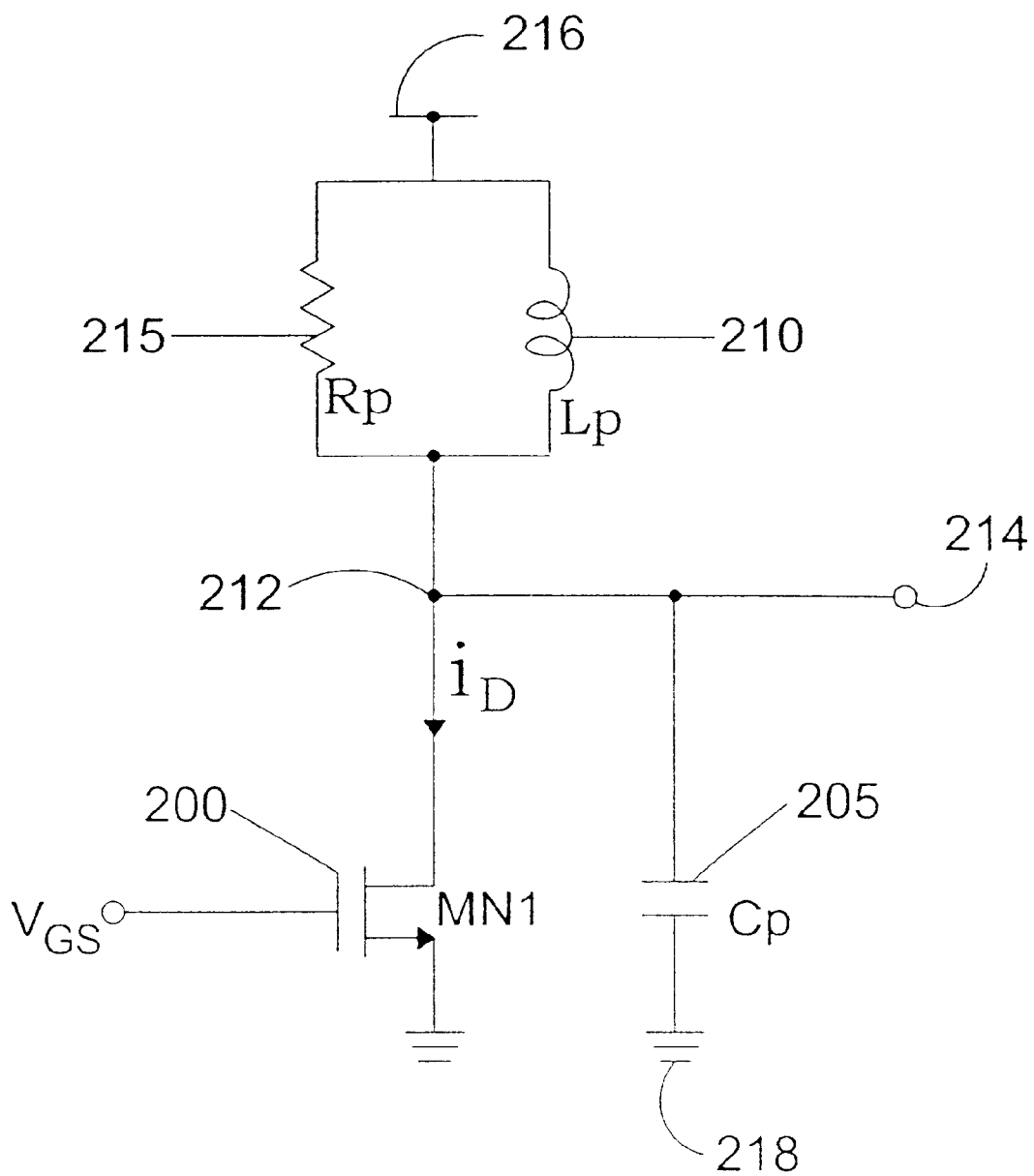
FIG. 2(a) is a circuit diagram of a low-noise amplifier with a desired gain in a narrow band of frequencies according to an embodiment of the invention.

FIG. 2(a) is a diagram that shows a preferred embodiment of an amplifier according to the present invention. FIG. 2(a) shows a tuned LNA which has a desired gain in a narrow band of frequencies. The LNA may be constructed with an n-channel MOS (NMOS) transistor MN1 200 and a load composed of a capacitor Cp 205, an inductor Lp 210, and a resistor Rp 215. An input signal may be applied at the gate node of the common-source NMOS transistor (MN1) 200, and its amplified signal may appear at the drain node 212 or an output terminal 214 may be coupled thereto. Preferably, the resistor Rp 215 and the inductor Lp 210 are coupled between a power supply voltage 216 (e.g., Vdd) and the drain node 212, and the capacitor Cp 205 is coupled between a ground terminal 218 and the drain node 212. The capacitance Cp 205 may be attributed to the input capacitance of the next stage (e.g. a mixer) and/or parasitic capacitance at the output node. The inductor Lp 210 preferably forms a parallel-resonant circuit with the capacitor Cp 205, and tunes the LNA's gain at a desired frequency, locating the peak of gain at the resonant frequency. The inductor 210 may be implemented using a spiral or a bond-wire inductor (or by using an external inductor).

To adaptively control the gain of the LNA and avoid the input signal distorting the output (by saturating or cutting off), resistor Rp 215 may be variable according to one preferred embodiment of the invention. Reducing the drain bias current (i.e., the DC component of $i_D$ in FIG. 2(a)) in order to lower the gain for increased magnitude of input signal saves power, but involves a possible degradation of linearity caused by the unwanted cutoff operation of MN1 200. Decreasing the value of Rp 215 in FIG. 2(a) to lower the gain, however, does not affect linearity of the LNA. Hence, to change gain, Rp 215 may be controlled rather than the drain bias current, provided the linearity is more important than reduction of power consumption.

The gain is proportional to $Rp^2$ at the resonant frequency. Accordingly, the gain is proportional to the quality factor $Q^2$ of the resonant circuit (i.e., proportional to the sharpness of the gain peak) for fixed values of Cp 205 and Lp 210, since the quality factor Q of the resonating load is directly proportional to Rp 215:

$$Q = Rp\sqrt{\frac{Cp}{Lp}} \quad \text{(Eq. 1)}$$

Hence, controlling Rp 215 is equivalent to controlling Q for fixed values of Cp 205 and Lp 210.

Figure 2C:
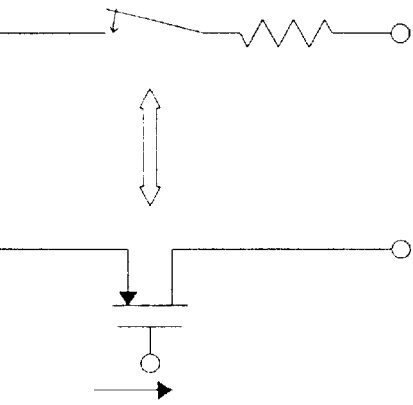
FIG. 2(c) is a circuit diagram of a PMOS transistor operating as a switch with a turn-on resistance according to an embodiment of the invention.
Figure 2B:
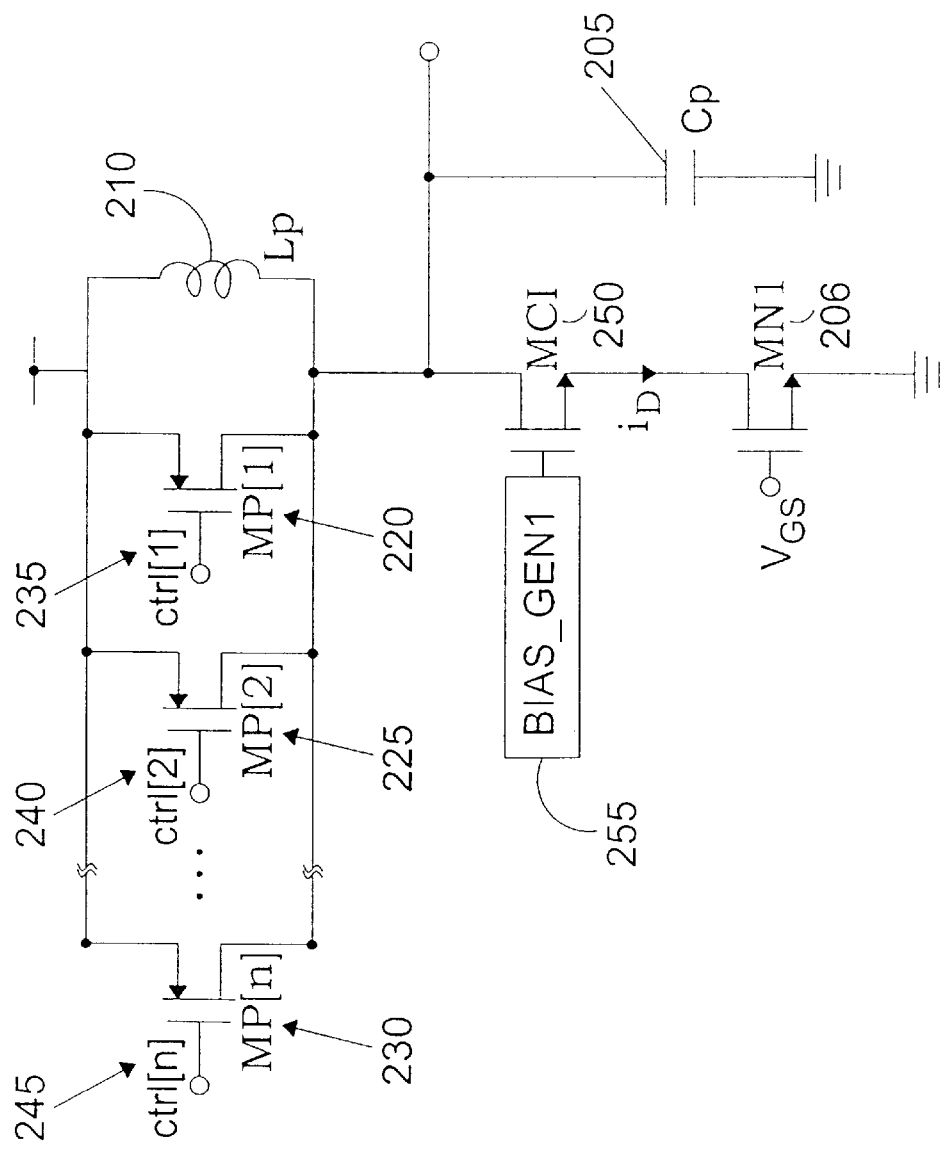
FIG. 2(b) is a circuit diagram of an embodiment for the amplifier in FIG. 2(a) according to an embodiment of the invention.

FIG. 2(b) shows a preferred embodiment of a circuit implementation for the amplifier in FIG. 2(a). The variable resistor or a variable resistance as shown in FIG. 2(b) is implemented with the p-channel MOS PMOS) transistors MP[1]~MP[n] (220, 225, 230) aligned in parallel. Each PMOS transistor is made to operate in its linear region when turned on (i.e., when its gate voltage is lowered), so it can be regarded as a switch with a turn-on resistance as shown in FIG. 2(c). The net resistance is controlled by the logic of the gate signals ctrl[1]~ctrl[n](235,240, . . . 245). Controlling these PMOS switches one by one, the amplifier's gain is adjusted stepwise. The amplifier has minimum gain when all these PMOS switches are turned on (by lowering all their gate voltages).

A common-gate NMOS transistor MC1 250 is added to further isolate the input from the output, reducing the Miller effect. The bias-generating block BIAS_GEN 1 255 keeps the operation of MC1 250 unaffected or less affected by the swing of the output signal by maintaining MC1 250 in the saturation region.

It is true that decreasing the load's Q degrades the linearity less than reducing the DC bias current, but at the expense of higher power consumption relative to other approaches. To maintain the linearity with the circuit in FIG. 2(b), the drain bias current must be maintained, being accompanied by a constant DC power consumption. Because the conductance parameter k (proportional to the gate width) of MN1 200 is fixed for the circuit in FIG. 2(b), it is impossible to reduce the amplifier's DC power consumption. If the DC power consumption must be reduced, a new approach of gain control may be necessary.

Figure 3A:
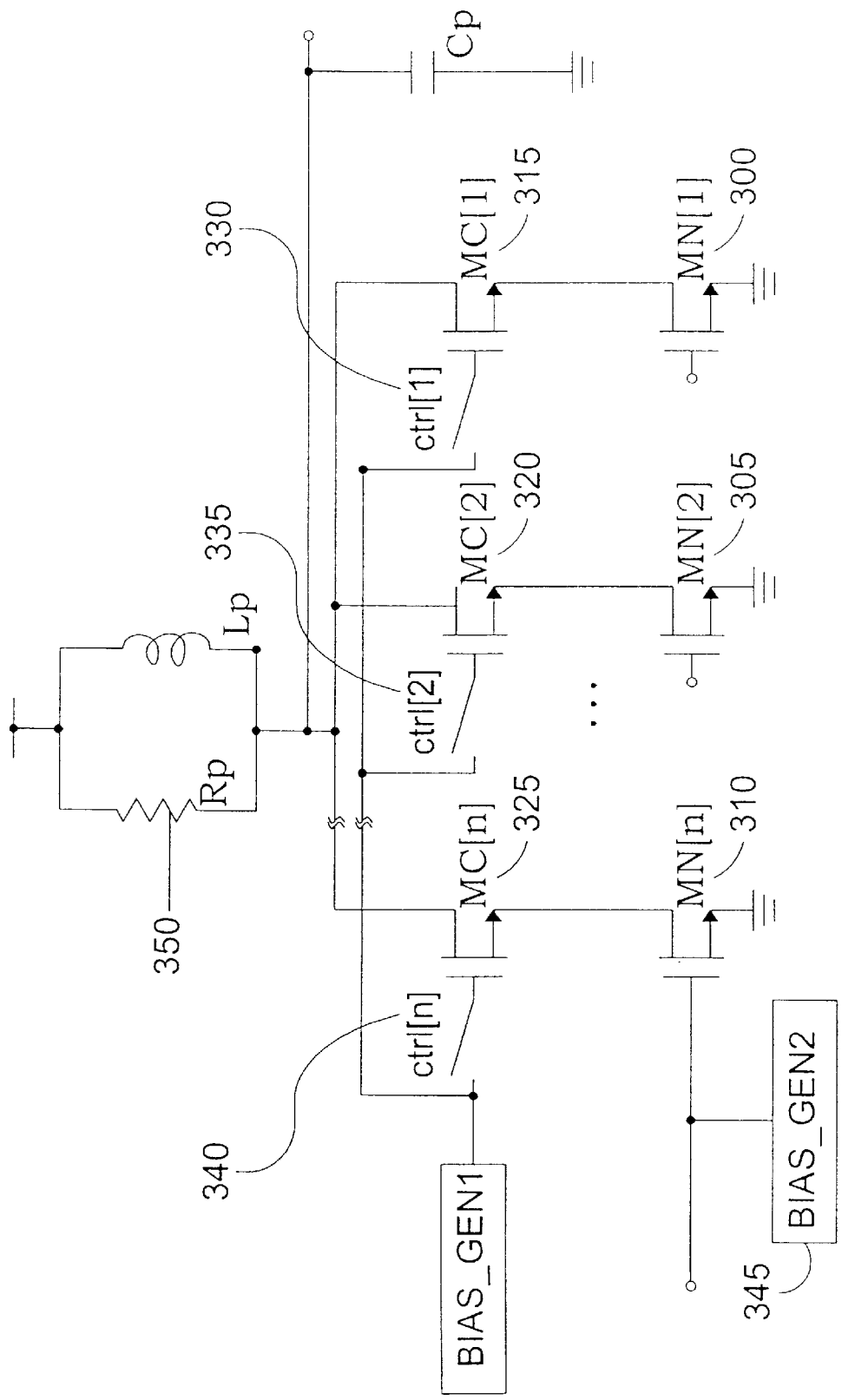
FIG. 3(a) is a circuit diagram illustrating a circuit designed to reduce power consumption by providing a variable conductance parameter k which is achieved by dividing the driving transistor MN1 into distributed NMOS transistors MN[1]–MN[n] according to an embodiment of the invention.
Figure 3B:
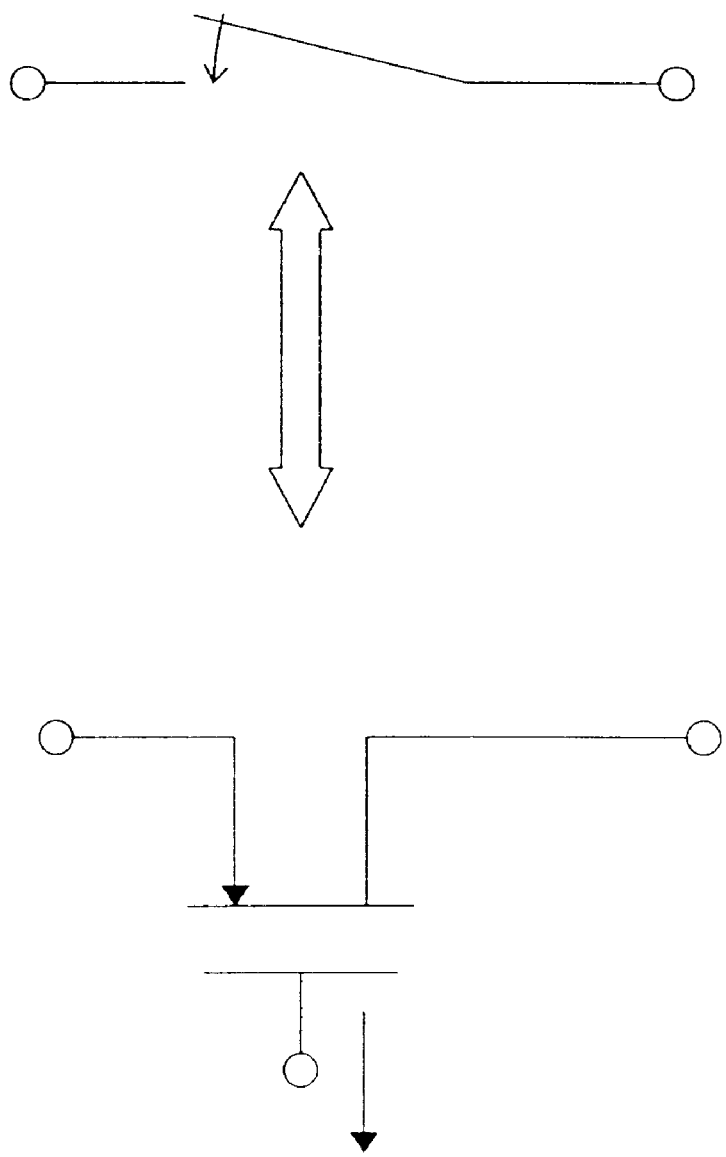
FIG. 3(b) is a circuit diagram of the PMOS switches which turn the NMOS transistors MC[1]–MC[n] on and off according to an embodiment of the invention.

To reduce the power consumption by making k variable, a circuit in FIG. 3(a) may be used in a preferred embodiment according to the present invention. As shown in FIG. 3(a), the driving transistor MN1 200 is divided into the distributed NMOS transistors MN[1]~MN[n] (e.g., 300, 305, . . . 310). These transistors are controlled by the corresponding NMOS transistors MC[1] MC[n] (e.g., 315, 320, . . . 325), which are respectively turned on and off by the corresponding PMOS switches 330, 335, . . . 340 also illustrated by example in FIG. 3(b). As the magnitude of the input grows, it may be preferable to increase the gate bias voltage with BIAS_GEN2 345 signal in FIG. 3(a) to maintain the linearity. To decrease the gain and reduce the DC power consumption at the same time, it may be preferable to decrease the value of k at a much faster rate than the rate of increase of the gate bias. Here, a trade off is needed between the reduction of power consumption and the smoothness of gain control, since the fast variation of k entails widened gaps of gain steps. Advantageously, smoother gain control results if the pull-up resistor (Rp) 350 is made variable as described for Rp 215. In one preferred embodiment, the variable resistance may be implemented with p-channel MOS (PMOS) transistors as in FIG. 2(b).

Figures 4A, 4B:
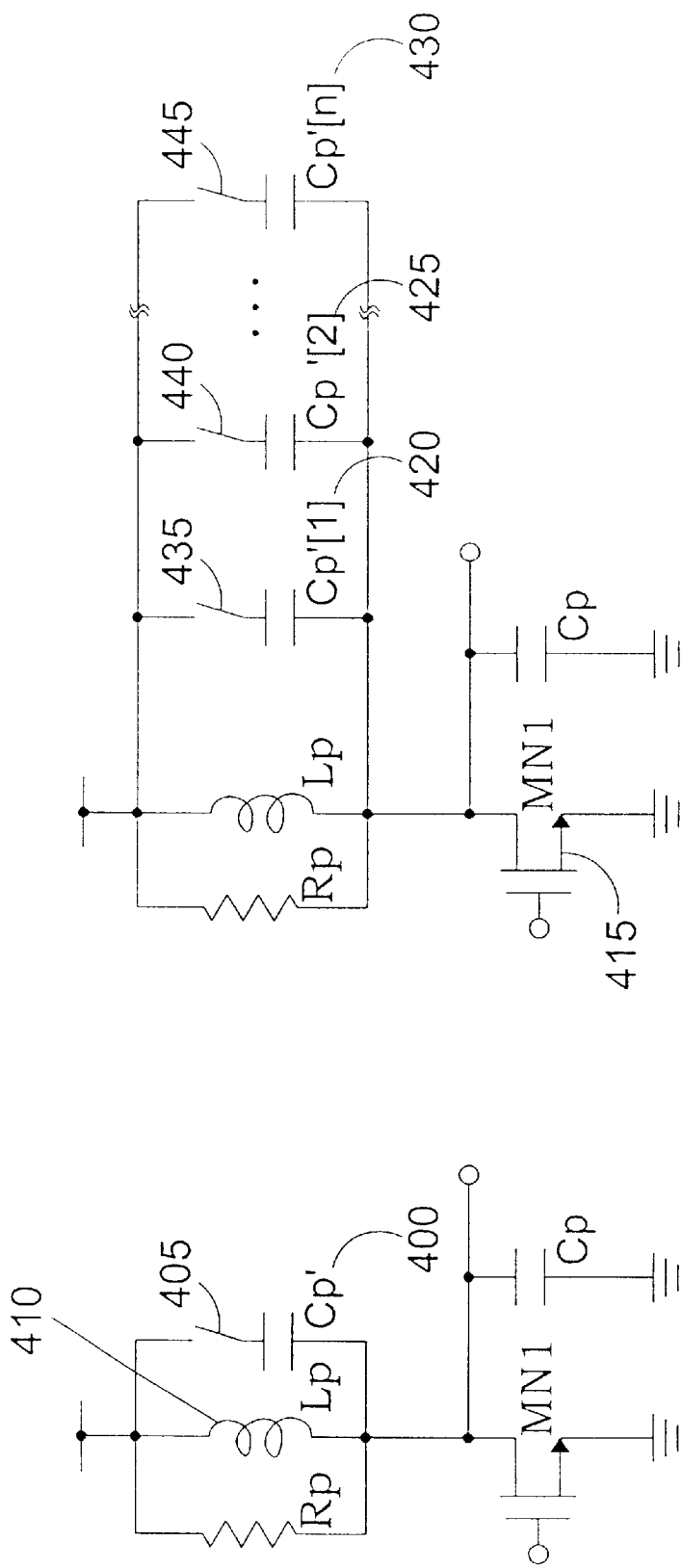
FIG. 4(a) is a circuit diagram illustrating a circuit which is capable of switching between two resonant frequencies according to an embodiment of the invention.
FIG. 4(b) is a circuit diagram illustrating a generalized version of FIG. 3(a) which enables multi-band operation using a single driving transistor MN1, according to an embodiment of the invention.

The circuit in FIG. 3(a) may also be used for a transmitter's preamplifier in a wireless terminal unit, but in this case it may necessary to place a low capacitive load at its output. This is because a typical preamplifier drives the power amplifier whose input impedance may be set to 50Ω (a standard impedance in microwave engineering). [31] A pull-up capacitor Cp' 400 may be connected in parallel with the pull-up A inductor Lp 410 and turned on and off with its series-connected switch 405 as shown in FIG. 4(a). For this preferred embodiment according to the invention, switch 405 may be implemented with a complementary-MOSFET (CMOS) "transmission gate," in which case the resonant frequency may be shifted down and up correspondingly. The resonant frequency may be made to fall on another desired frequency band, provided that the amplifier functions stably at the shifted band. One example of dual-band operation may be an amplifier for wireless communication, usable for a cellular band around 800 MHZ and a PCS band around 1800 MHZ (time-multiplexingly). The desired frequency band may be selected by an external signal that controls the CMOS switch. Additional band selectivity may be achieved by employing the circuit shown in FIG. 4(b), which is an alternative preferred embodiment to the circuit in FIG. 4(a). The preferred embodiment shown in FIG. 4(b) can achieve multi-band operation with a single driving transistor MN1 415. In operation, capacitors Cp'[1]~Cp'[n] (e.g., 420, 425, . . . 430) may be turned on and off discretely or combinationally by corresponding series-connected switches (e.g., 435, 440, . . . 445) (such as the CMOS transmission-gate switches).

As described above, preferred embodiments of methods and apparatus for gain control in a wireless communication system have various advantages. To avoid the clipping distortion of the output signal of an integrated preamplifier or low-noise amplifier employing MOSFET technology (e.g., in a terminal unit for wireless communication), the gain may be made adjustable by incorporating a variable resistor in the pull-up load according to the preferred embodiments. The variable resistor may be implemented using distributed PMOS transistors operating in the linear region as shown in FIG. 2(b). Also, to attain the controllability of the DC power consumption as well as the gain controllability, a driving transistor may be divided into the distributed transistors in a preferred embodiment, which can be turned on and off individually. In addition, a resonant frequency can be adjusted and/or a multi-band operation may be implemented in a preferred embodiment by selectively coupling an additional capacitor or the like in parallel with a load inductor.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A variable gain amplifier, comprising:
    a first transistor having a control electrode, a first electrode, a second electrode and a drain, wherein an input signal is coupled to the control electrode, a first reference voltage is coupled to the first electrode and an output signal is coupled to the second electrode;
    a load inductor coupled between a second reference voltage and the second electrode of the first transistor;
    a load capacitor coupled to the second electrode of the first transistor; and
    a variable resistor coupled in parallel to the load inductor.

2. The variable amplifier of claim 1, wherein the variable resistor comprises at least one transistor disposed in parallel to the load inductor, and coupled to a network of control lines.

3. The variable gain amplifier of claim 1, further comprising an isolating transistor coupled between the second electrode of the first transistor and the load capacitor.

4. The variable gain amplifier of claim 1, further comprising a plurality of second transistors that are coupled to a first network of corresponding gate electrode control lines, wherein each of the second transistors is coupled in parallel to the first transistor.

5. The variable gain amplifier of claim 4, further comprising a plurality of third transistors each coupled between a corresponding second electrode of the first and second transistors and the load capacitor.

6. The variable gain amplifier of claim 5, wherein the third transistors are coupled to a second network of corresponding gate electrode control lines.

7. The variable gain amplifier of claim 1, further comprising at least one pull-up capacitor coupled in parallel to the load inductor.

8. The variable gain amplifier of claim 1, further comprising a plurality of pull-up capacitors coupled in parallel with the load inductor, wherein the pull-up capacitors are independently selectable by a plurality of switches each coupling a corresponding one of the pull-up capacitors with the load inductor.

9. The variable gain amplifier of claim 8, wherein the switches are implemented in CMOS technology.

10. The variable gain amplifier of claim 8, wherein the pull-up capacitors are chosen to form a resonant circuit with a load resistance of the variable resistor and the load inductance depending on the selection of pull-up capacitors.

11. The variable gain amplifier of claim 10, wherein the circuit is resonant at 800 MHz or 1800 MHz.

12. The variable gain amplifier of claim 6, wherein the variable resistor comprises a plurality of load transistors coupled in parallel to the load inductor, wherein each of the load transistors has a gate electrode coupled to a corresponding one of a third network of control lines.

13. The variable gain amplifier of claim 12, further comprising a plurality of pull-up capacitors coupled in parallel with the load inductor, wherein the pull-up capacitors are independently selectable by a plurality of switches each coupling a corresponding one of the pull-up capacitors with the load inductor.

14. The variable gain amplifier of claim 12, further comprising:
    a plurality of second transistors that are coupled to a first network of corresponding gate electrode control lines, wherein each of the second transistors is coupled in parallel to the first transistor;
    a plurality of third transistors each coupled between a corresponding second electrode of the first and second transistors and the load capacitor, wherein the third transistors are coupled to a second network of corresponding gate electrode control lines; and
    an isolating transistor coupled between the second electrode of the first transistor and the load capacitor.

15. The variable gain amplifier of claim 14, further comprising a plurality of pull-up capacitors coupled in parallel with the load inductor, wherein the pull-up capacitors are independently selectable by a plurality of switches each coupling a corresponding one of the pull-up capacitors with the load inductor.

16. A multi-frequency amplifier comprising:
    a driving transistor having a source, a gate and a drain, wherein an input signal is input by an input terminal coupled to the gate, the source is coupled to a reference voltage source, and an output signal is output by an output terminal coupled to the drain;
    a load inductor coupled between a power voltage source and the output terminal;

a load capacitor coupled between the output terminal and the reference voltage source;

a variable resistor coupled between the power voltage source and the output terminal in parallel to the load inductor; and at least one pull-up capacitor deployed in parallel with the load inductor wherein each of the at least one pull-up capacitors are independently selectable by a plurality of switches coupling each of the at least one capacitors with the load inductor.

17. The multi-frequency amplifier of claim 16, further comprising an isolating transistor coupled between the drain of the driving transistor and the load capacitor.

18. The multi-frequency amplifier of claim 16, further comprising:

a plurality of additional driving transistors each coupled in parallel to the driving transistor, wherein the gate electrode of the driving transistor receives a variable bias voltage; and a plurality of isolating transistors coupled between drains of the driving transistors and the load capacitor, wherein the plurality of isolating transistors are selectively coupled to a network of gate electrode control lines.

19. The multi-frequency amplifier of claim 18, wherein the variable resistor comprises a plurality of load transistors coupled in parallel to the load inductor, and wherein each of the load transistors has a gate electrode coupled to a corresponding one of a third network of control lines.

20. The multi-frequency amplifier of claim 16, wherein the variable resistor comprises a plurality of load transistors coupled in parallel to the load inductor, and wherein each of the load transistors has a gate electrode coupled to a corresponding one of a third network of control lines.

21. The multi-frequency amplifier of claim 16, wherein the pull-up capacitors are chosen to form a resonant circuit with the load resistance and the load inductance depending on the selection of pull-up capacitors.

22. The multi-frequency amplifier of claim 19, wherein the circuit is resonant at 800 MHz or 1800 MHz, and wherein the switches are implemented in CMOS technology.

* * * * *

UNITED STATES PATENT AND TRADEMARK OFFICE
CERTIFICATE OF CORRECTION

PATENT NO.    : 6,424,222 B1
DATED         : July 23, 2002
INVENTOR(S)   : Jeong et al.

It is certified that error appears in the above-identified patent and that said Letters Patent is hereby corrected as shown below:

<u>Title page,</u>
Item [75], please correct the Inventors as follows:

-- [75] Inventors:    Joonbae Park; Hoe-Sam Jeong; Seung-Wook Lee; Won-Seok Lee; Kyeongho Lee, all of Seoul (KR) --

Signed and Sealed this

Twenty-sixth Day of November, 2002

Attest:

Attesting Officer

JAMES E. ROGAN
*Director of the United States Patent and Trademark Office*